United States Patent [19]

Gonzalez

[11] Patent Number: 5,005,072
[45] Date of Patent: Apr. 2, 1991

[54] STACKED CELL DESIGN FOR 16-MEGABIT DRAM ARRAY HAVING A PAIR OF INTERCONNECTED POLY LAYERS WHICH ENFOLD A SINGLE FIELD PLATE LAYER AND CONNECT TO THE CELL'S STORAGE NODE JUNCTION

[75] Inventor: Fernando Gonzalez, Boise, Id.
[73] Assignee: Micron Technology, Inc., Boise, Id.
[21] Appl. No.: 471,998
[22] Filed: Jan. 29, 1990
[51] Int. Cl.⁵ .................. H01L 29/68; H01L 29/78; H01L 29/92
[52] U.S. Cl. .................. 357/23.6; 357/51; 357/59; 357/71
[58] Field of Search .............. 357/23.6, 51, 59 R, 357/71 P

[56] References Cited

U.S. PATENT DOCUMENTS 4,685,197 8/1987 Tigelaar et al. ............ 357/51
4,864,464 9/1989 Gonzalez .................. 357/23.6

FOREIGN PATENT DOCUMENTS 63-133565 6/1988 Japan .................. 357/23.6
1-100960 4/1989 Japan .................. 357/23.6

Primary Examiner—Andrew J. James
Assistant Examiner—Sara W. Crane
Attorney, Agent, or Firm—Angus C. Fox, III; Stanley N. Protigal

[57] ABSTRACT

A stacked cell design for the 16-megabit generation of DRAMs having a cell capacitor comprising a pair of interconnected doped poly storage-node plate layers which insulatedly enfold a single field plate layer and connect to the cell's storage node junction. This triple-layer stack utilizes separate polycrystalline silicon (poly) layers for the lower storage-node plate and the field plate. These two poly layers are dielectrically-insulated by a first nitride layer, and each is patterned by separate masks. Following the deposition of a second nitride layer and a third poly layer on top of the field plate layer, a channel is etched in a direction parallel to the array column, through to the first nitride layer. A portion of the lower storage-node plate layer is covered only by the first nitride layer in this channel region. The edges of the field plate layer and the edges and upper surface of the third poly layer are then oxidized, and exposed portions of the first nitride layer are then etched away, as is the oxide covering the third poly layer. A fourth poly layer is then deposited on top of the third poly layer, over the oxidized edge of the field-plate layer and on top of a portion of the now-exposed lower storage-node plate, following which the two uppermost poly layers are simultaneously conductively doped. These two uppermost poly layers are then patterned with a photoresist mask and etched to create an upper storage-node plate.

4 Claims, 10 Drawing Sheets

STACKED CELL DESIGN FOR 16-MEGABIT DRAM ARRAY HAVING A PAIR OF INTERCONNECTED POLY LAYERS WHICH ENFOLD A SINGLE FIELD PLATE LAYER AND CONNECT TO THE CELL'S STORAGE NODE JUNCTION

FIELD OF THE INVENTION

This invention is related to semiconductor devices. More specifically, it is related to capacitor design for dynamic random access memory (DRAM) cells. The focus of the invention is the construction of a stacked DRAM cell having a storage node plate comprised of a pair of poly layers which enfold a single field plate layer, utilizing only one additional mask step beyond the number used to create a single-layer storage node plate design.

BACKGROUND OF THE INVENTION

The memory cells of dynamic random access memories are comprised of two main components: a field-effect transistor and a capacitor. In DRAM cells utilizing a conventional planar capacitor (such as the one depicted in FIG. 1), far more chip surface area is dedicated to planar capacitor 11 than to field-effect transistor (FET) 12. The gate 13 of FET 12 and the word line 14 are formed from an etched polycrystalline silicon-1 layer. Bit line 15 connects with access-node junction 16. Capacitor 11 has a lower plate formed from the n+ silicon substrate extension 17 of storage-node junction 18 of FET 12. Upper capacitor plate (or field plate) 19 is formed from a layer of conductively-doped polycrystalline silicon. Substrate extension 17 is electrically insulated from upper plate 19 by a dielectric layer 20. Planar capacitors have generally proven adequate for use in DRAM chips up to the one-megabit level. However, planar capacitors constructed with conventional dielectric materials appear to be unusable beyond the one-megabit DRAM level. As component density in memory chips has increased, the shrinkage of cell capacitor size has resulted in a number of problems. Firstly, the alpha-particle component of normal background radiation will generate hole-electron pairs in the n+ silicon substrate plate of a cell capacitor. This phenomena will cause the charge within the affected cell capacitor to rapidly dissipate, resulting in a "soft" error. Secondly, the sense-amp differential signal is reduced. This aggravates noise sensitivity and makes it more difficult to design a sense-amp having appropriate signal selectivity. Thirdly, as cell capacitor size is decreased, the cell refresh time must generally be shortened, thus requiring more frequent interruptions for refresh overhead. The difficult goal of a DRAM designer is therefore to increase or, at least, maintain cell capacitance as cell size shrinks, without resorting to processes that reduce product yield or that markedly increase the number of masking and deposition steps in the production process.

Several methods for providing adequate cell capacitance in the face of shrinking cell size are either in use or under investigation. Basically, the efforts fall into two categories. Efforts within the first category are aimed at creating complex three-dimensional dimensional capacitors; those within the second are aimed at improving the dielectric of the planar capacitor.

The three-dimensional technique currently receiving the most attention involves the creation of "trench" capacitors in the cell substrate. FIG. 2 depicts a DRAM cell having a typical trench capacitor 21. Similar in concept to planar capacitor 11 of FIG. 1, the trench is employed to provide greater plate area, and hence, greater capacitance. The lower plate 22 is still formed from n+ silicon substrate, while the upper plate 23 is formed from a layer of conductively-doped polycrystalline silicon. Lower plate 22 and upper plate 23 are electrically insulated with a dielectric layer 24. DRAM chips employing trench capacitors have been built by a number of European, Japanese and U.S. companies, including Texas Instruments Inc., Nippon Electric Company, Toshiba, Matsuchita and Mitsubishi Electric Corporation. There are several problems inherent in the trench design, not the least of which is trench-to-trench capacitive charge leakage which is the result of a parasitic transistor effect between trenches. Another problem is the difficulty of completely cleaning the capacitor trenches during the fabrication process; failure to completely clean a trench will generally result in a defective cell.

Another three-dimensional technique, which is being used by Mitsubishi Electric Company, Hitachi, and Fujitsu Ltd., is the stacking of capacitor plates between dielectric layers on the DRAM cell surface. FIG. 3 is a graphic representation of a typical DRAM cell having a stacked capacitor 31. The lower plate 32 is formed from n-type polycrystalline silicon, while the upper plate 33 is formed from a conductively-doped polycrystalline silicon layer. The two layers are separated by a dielectric layer 34. Lower plate 32 and upper plate 33 are both stacked on top of FET 12 and interconnect word line 35, resulting in a high-profile cell which requires more stringent process control for the connection of bit line 36 to access-node junction 37.

Alternatively, other schemes involve the use of ferroelectric materials for DRAM cell capacitor dielectrics. Since ferroelectric materials have a dielectric constant more than 100 times that of silicon oxides, the use of such materials has the potential for allowing the size of the DRAM-cell capacitor to be shrunk to one of the smaller cell elements without resorting to three-dimensional structures. Critics of ferroelectric materials point out that such materials suffer from a "wearout" mechanism. In addition, they warn that there are many chemical incompatibilities with the other materials used in integrated circuit fabrication and that the layering of ferroelectric films within integrated circuit structures has not yet been done successfully.

SUMMARY OF THE INVENTION

The present invention is a triple-layer stack design for a DRAM cell that can be created with only one additional mask step beyond the number required to create a cell having a conventional double-layer stack design. The invention draws on certain techniques that are disclosed in U.S. Pat. No. 4,864,464 by the same inventor.

FIG. 4 is a cross-sectional view of a DRAM cell fabricated in accordance with that patent. The cell is characterized by a low-profile, folded-plate capacitor 41 which can be fabricated with only two photoresist masks using equipment and processes identical to those used for the fabrication of DRAM cells having planar capacitors. The n+ silicon substrate 42, which is an extension of the cell's FET storage-node junction 43, functions as the lower half of the capacitor's storage-node plate. The capacitor's field plate 44 is comprised of a doped polycrystalline silicon-2 (poly-2) layer. The field plate 44 is insulated on its lower surface from the n+ silicon substrate 42 by a first silicon nitride dielectric layer 45; it is insulated on its edges by a silicon dioxide dielectric border 46 and on its upper surface by a second silicon nitride dielectric layer 47 from the upper half of the storage-node plate, which is comprised of a sandwich of n-type poly-3 layer 48 and n-type poly-4 layer 49. The upper half of the storage-node plate is tied to the n+ silicon substrate 42 with a buried contact 50, which is an extension of the poly-4 layer 49. The folded-plate capacitor, compared with a planar capacitor occupying comparable cell surface area, has nearly double the capacitance and greater resistance to alpha-particle-generated soft errors.

There are two basic differences between the cell of U. S. Pat. No. 4,864,464 and the cell of the present invention. The first is that the present invention does not use an extension of the storage-node junction (item 42 in FIG. 4) as a capacitor plate; the lower of the two layers which function as the cell's storage-node plate merely makes contact with the junction region. The second is that the capacitor of the present invention is constructed on top of the cell's FET access transistor, as well as on top of an intercolumn field oxide region; the cell of the aforementioned patent was constructed entirely within the confines of the cell's active area so as to maintain a low profile with respect to the cell's access transistor in order to avoid step-coverage problems during bit-line formation. Step coverage problems in the new design are resolved by used a buried bit line. Whereas the cell design of the referenced patent was limited to DRAM density generations of 4-megabits or less (as a 4-megabit design, capacitance was marginal, unless an additional capacitive layer was added), cells constructed in accordance with the present invention have sufficient capacitance to serve as a reliable 16-megabit design.

Like most contemporary stack designs, the cell capacitor of the present invention is constructed on top of the cell active area and on top of an adjacent word line. Separate polycrystalline silicon (poly) layers are utilized for a lower storage-node plate and the field plate. These two capacitive poly layers are dielectrically-insulated by a first nitride layer, and each is patterned by separate masks, since the field plate layer is generally grounded and must run the length of an array column. Following the deposition of a second nitride layer and an upper storage-node plate poly layer on top of the field plate layer, a masking and etch step is used to create a channel, in a direction parallel to the array column, through to the first nitride layer. A portion of the lower storage-node plate layer is covered only by first nitride layer in this channel. The edges of the field plate layer and the edges and upper surface of the upper storage-node plate poly layer are then oxidized. Exposed portions of the first nitride layer are then etched away, as is the oxide covering the upper storage-node plate layer. A tying poly layer is then deposited on top of the upper storage-node plate layer, over the oxidized edge of the field-plate layer and on top of a portion of the lower storage-node plate layer, following which the two uppermost poly layers are simultaneously conductively doped with phosphorus. These two uppermost poly layers are then patterned with a photoresist mask and etched in order to isolate the pair of storage-node plate layers from those of other cells within the array. Up to a near doubling of cell capacitance may be thus attained with the use of only one additional mask step.

BRIEF DESCRIPTION OF THE DRAWINGS

FIGS. 1 through 4 are cross-sectional representations of prior-art DRAM cell designs, while

Figure 1:
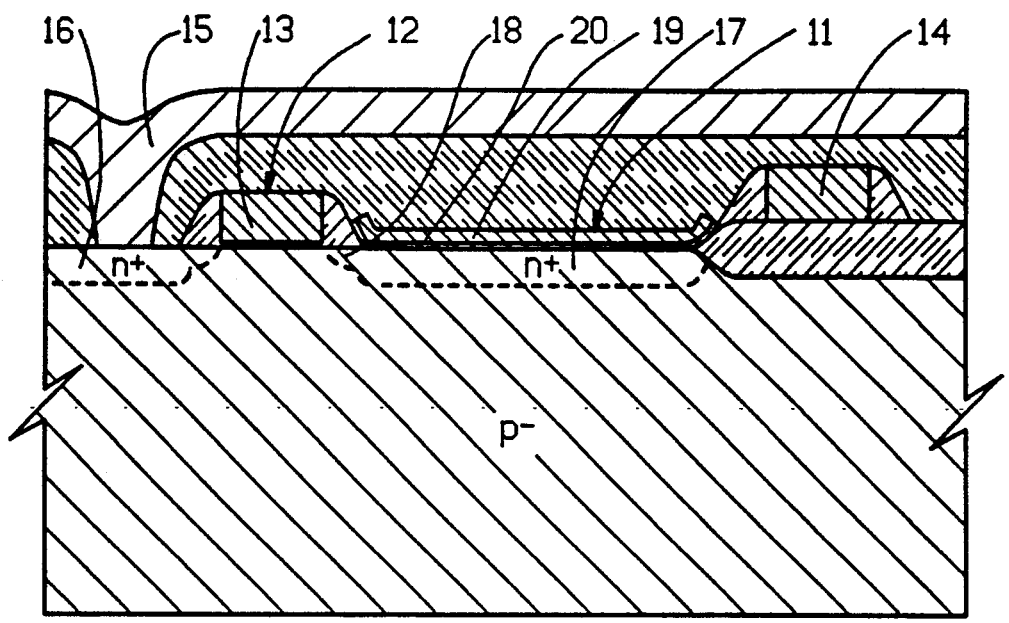
Figure 2:
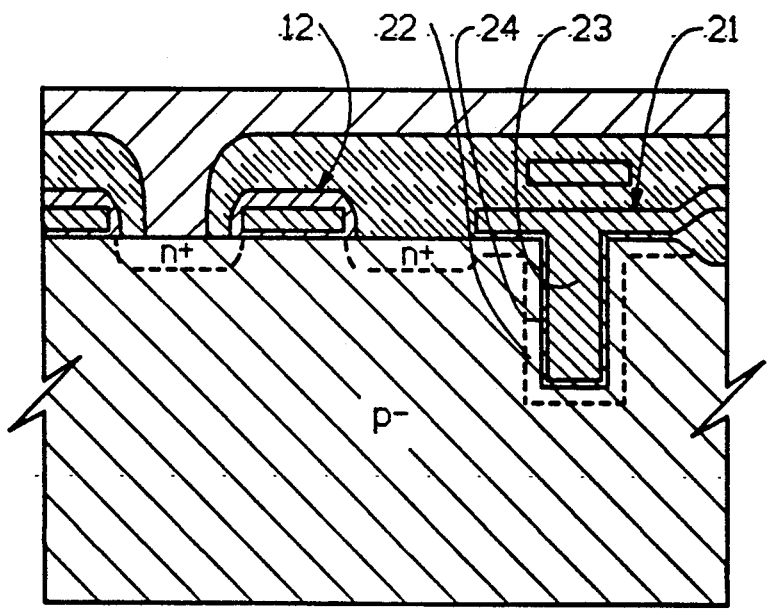
Figure 3:
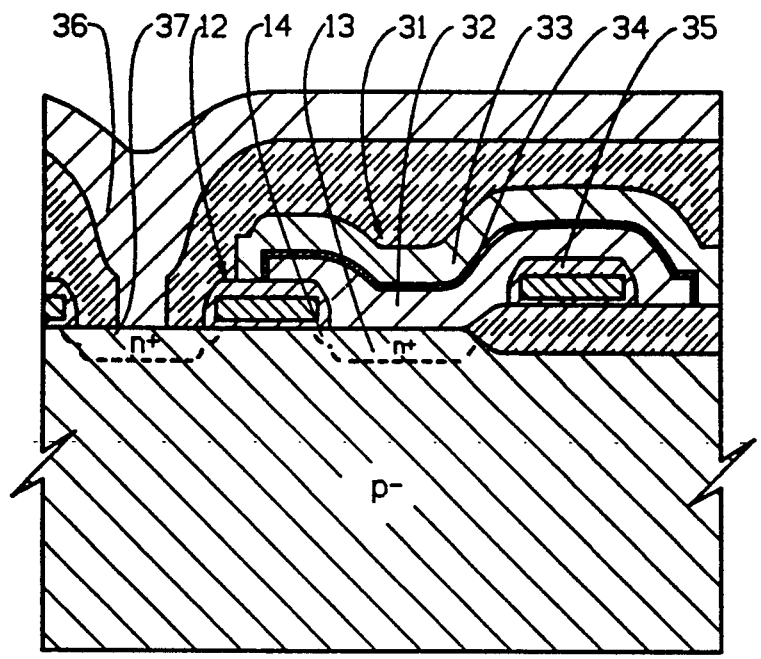
Figure 4:
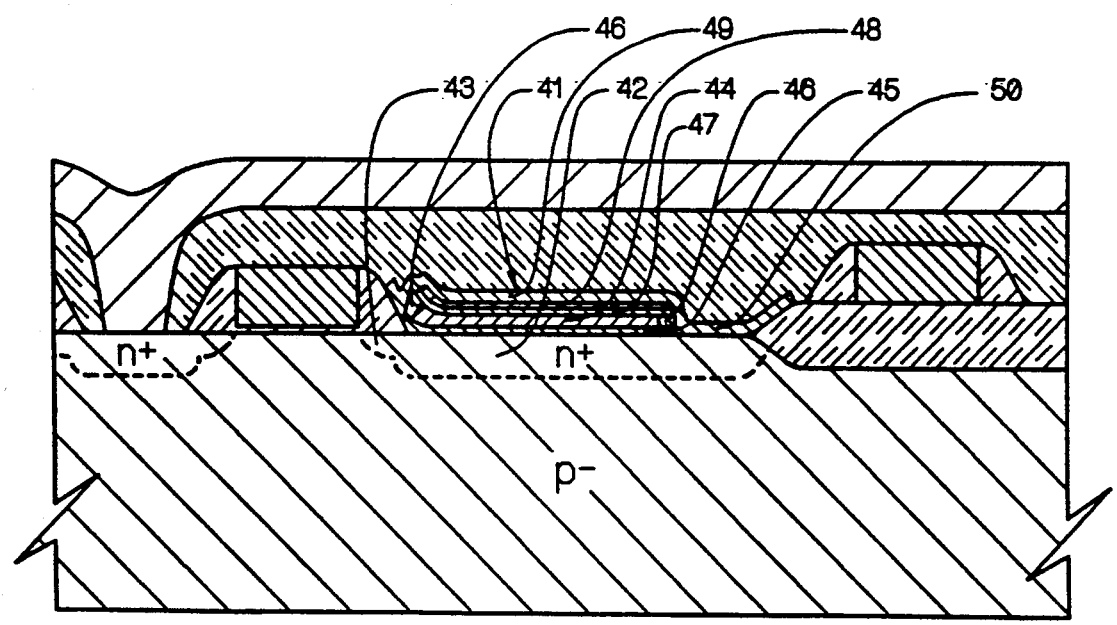
Figure 5:
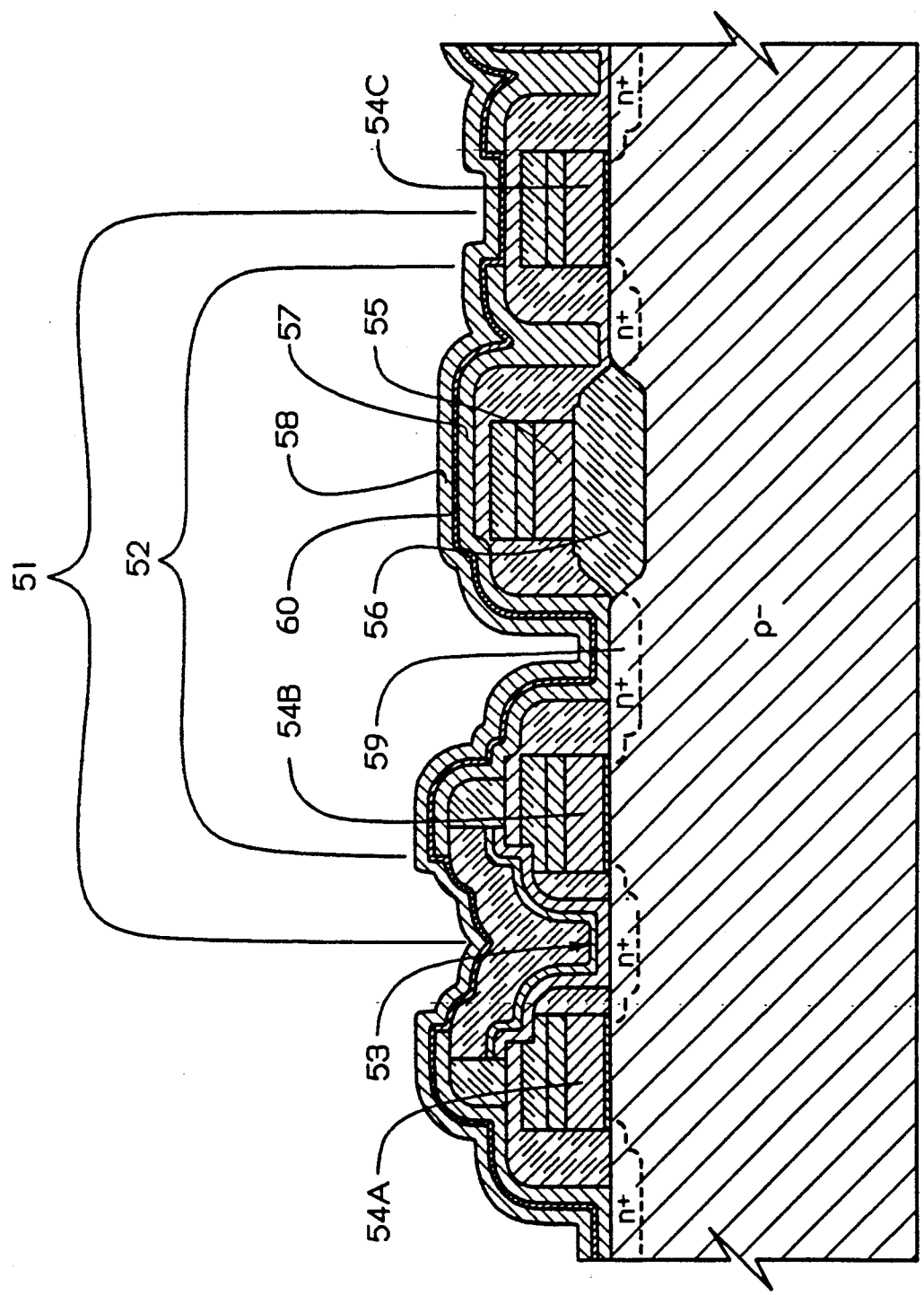
FIG. 5 through 12 are cross-sectional views which depict the step-by-step fabrication of a DRAM cell in accordance with the present invention.
Figure 6:
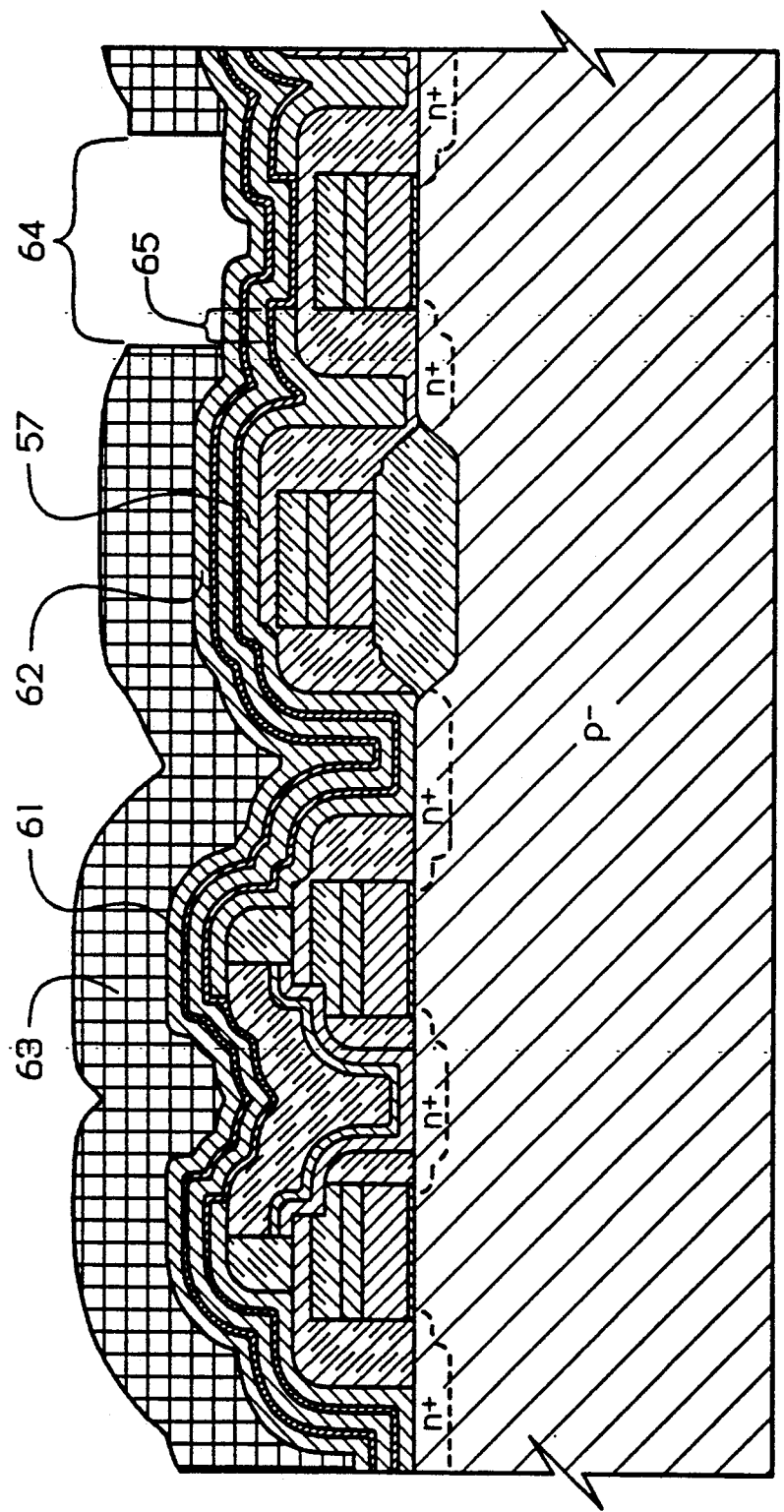
Figure 7:
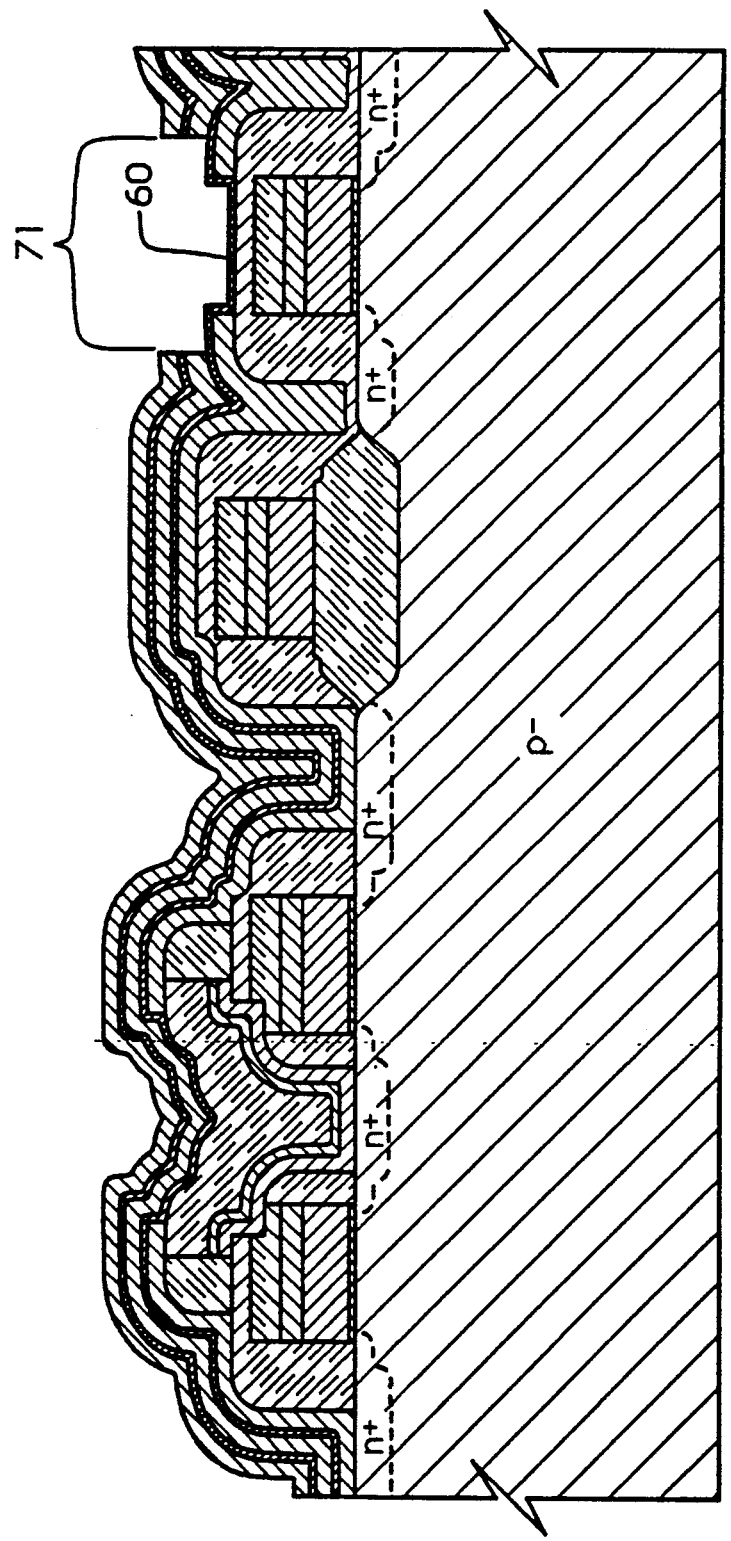
Figure 8:
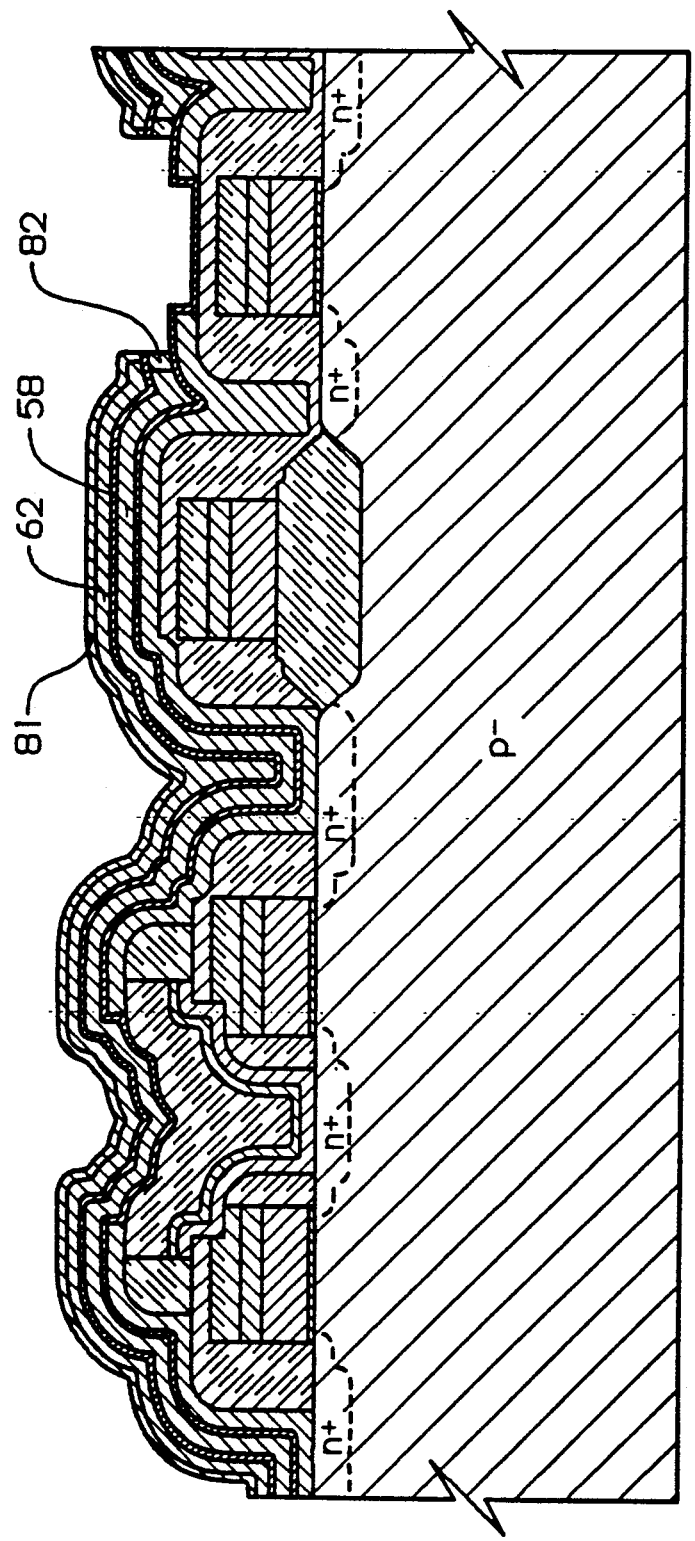
Figure 9:
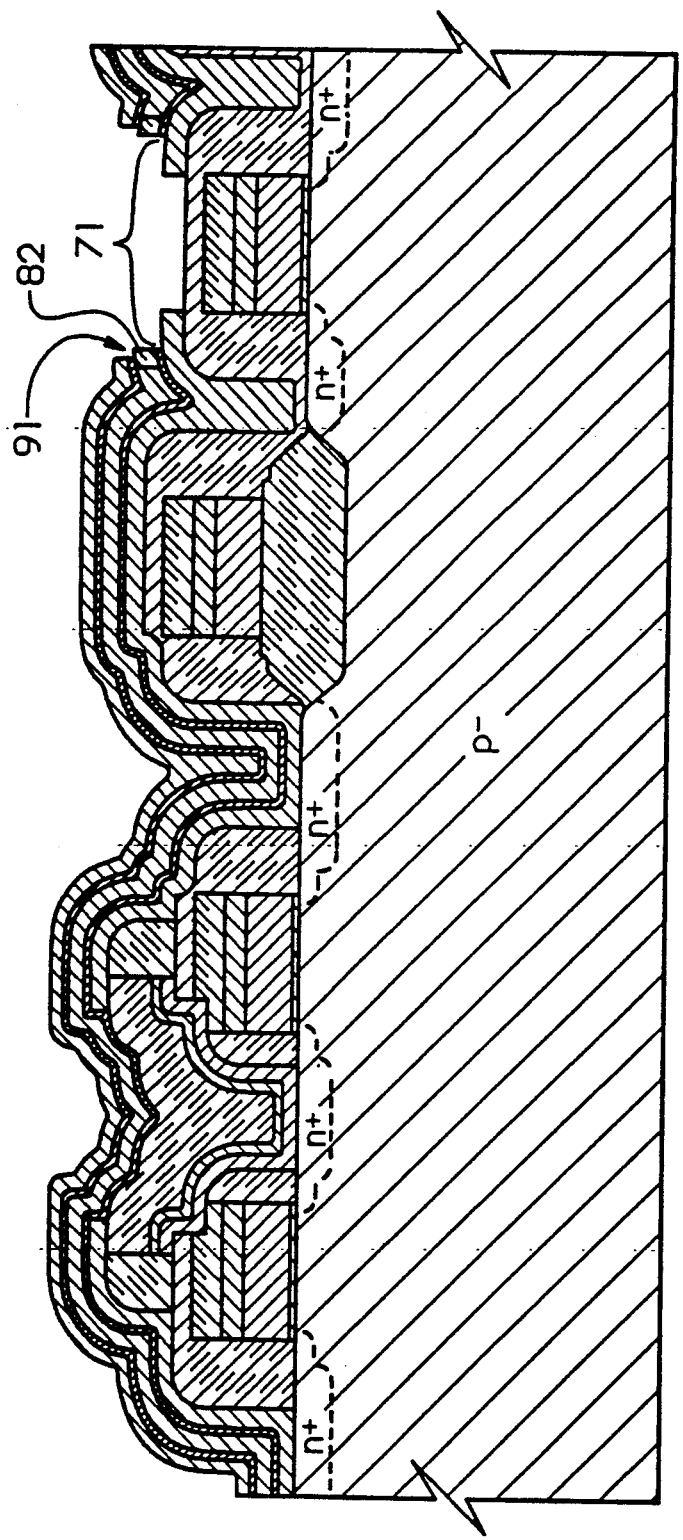
Figure 10:
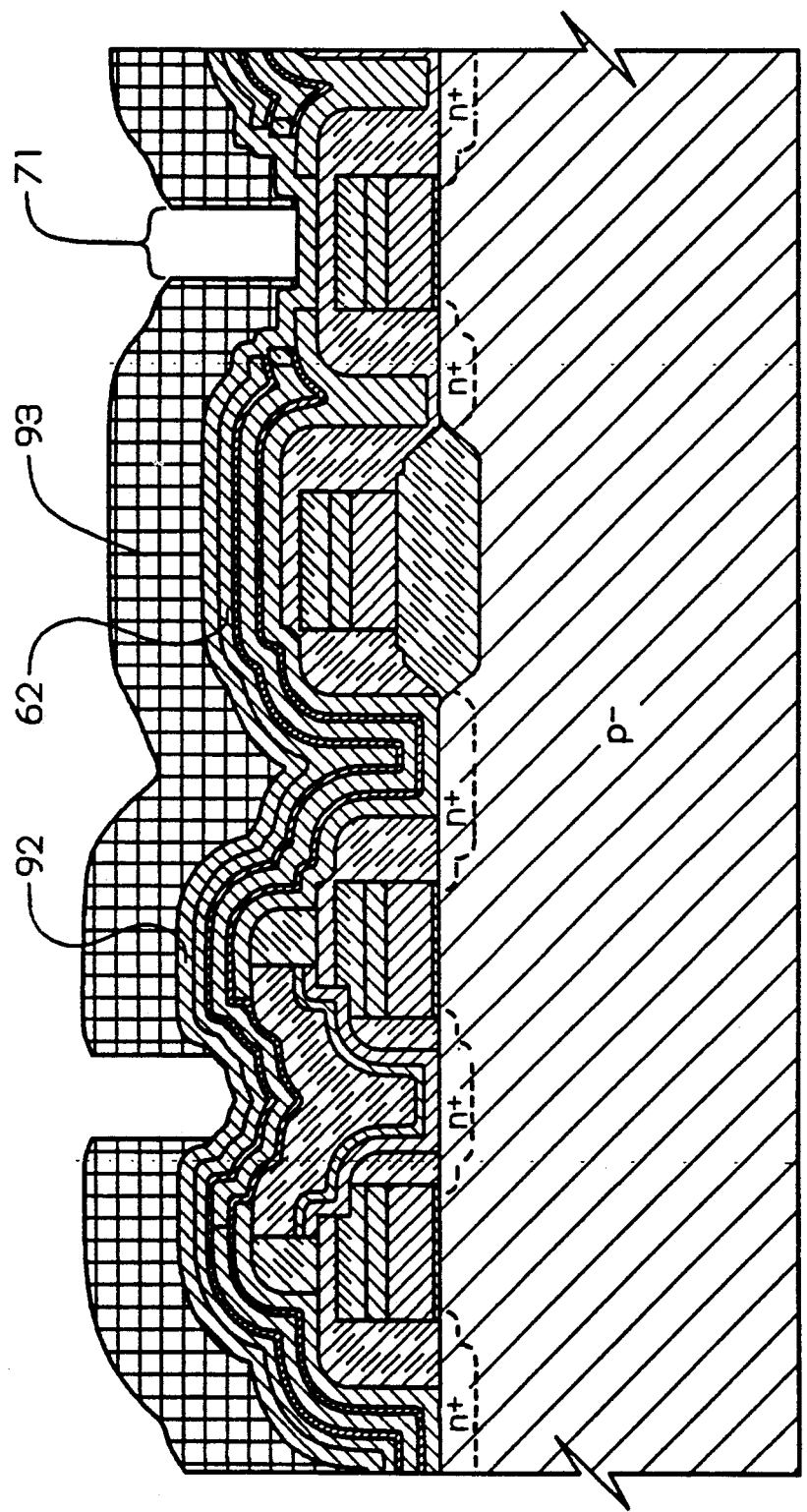
Figure 11:
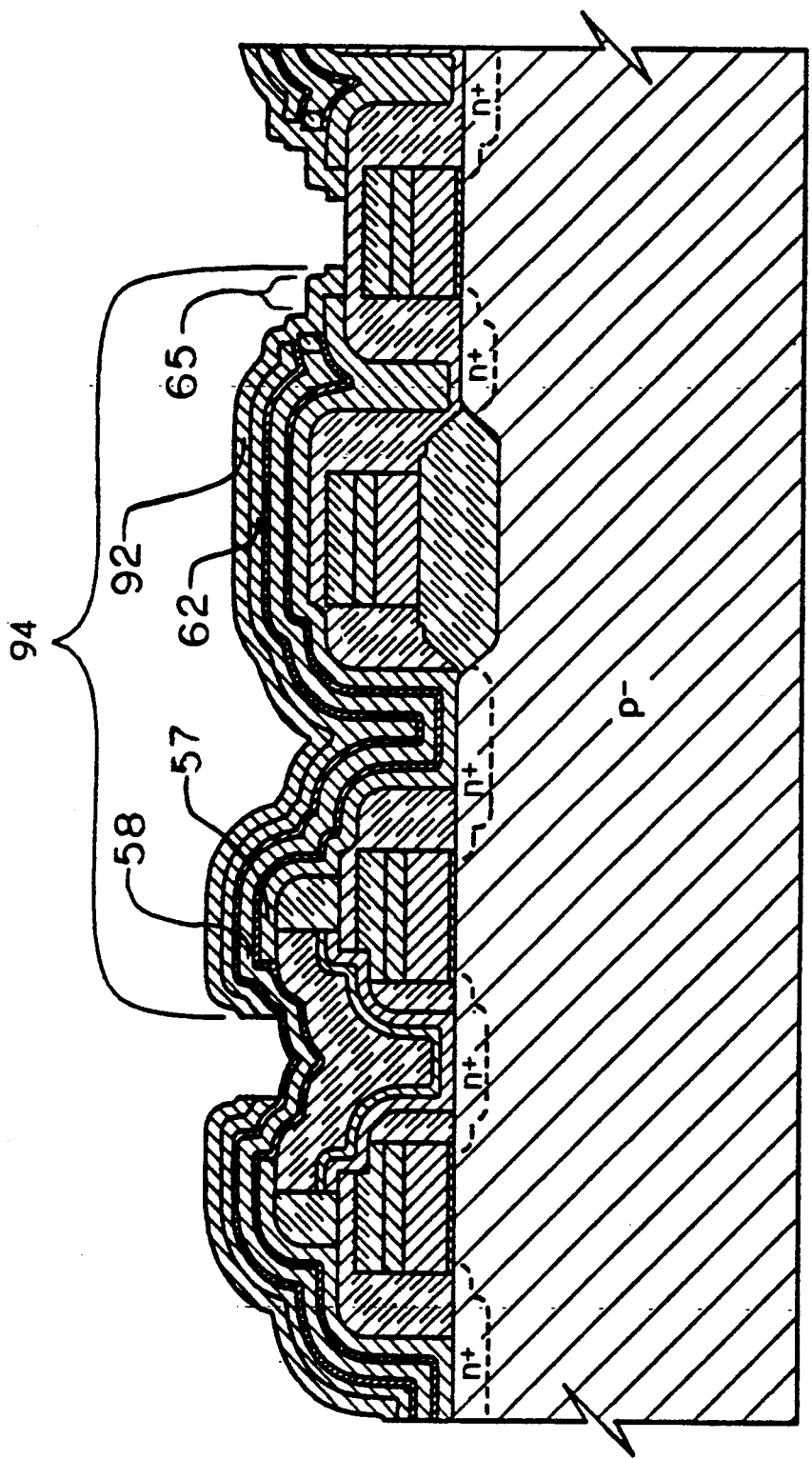
Figure 12:
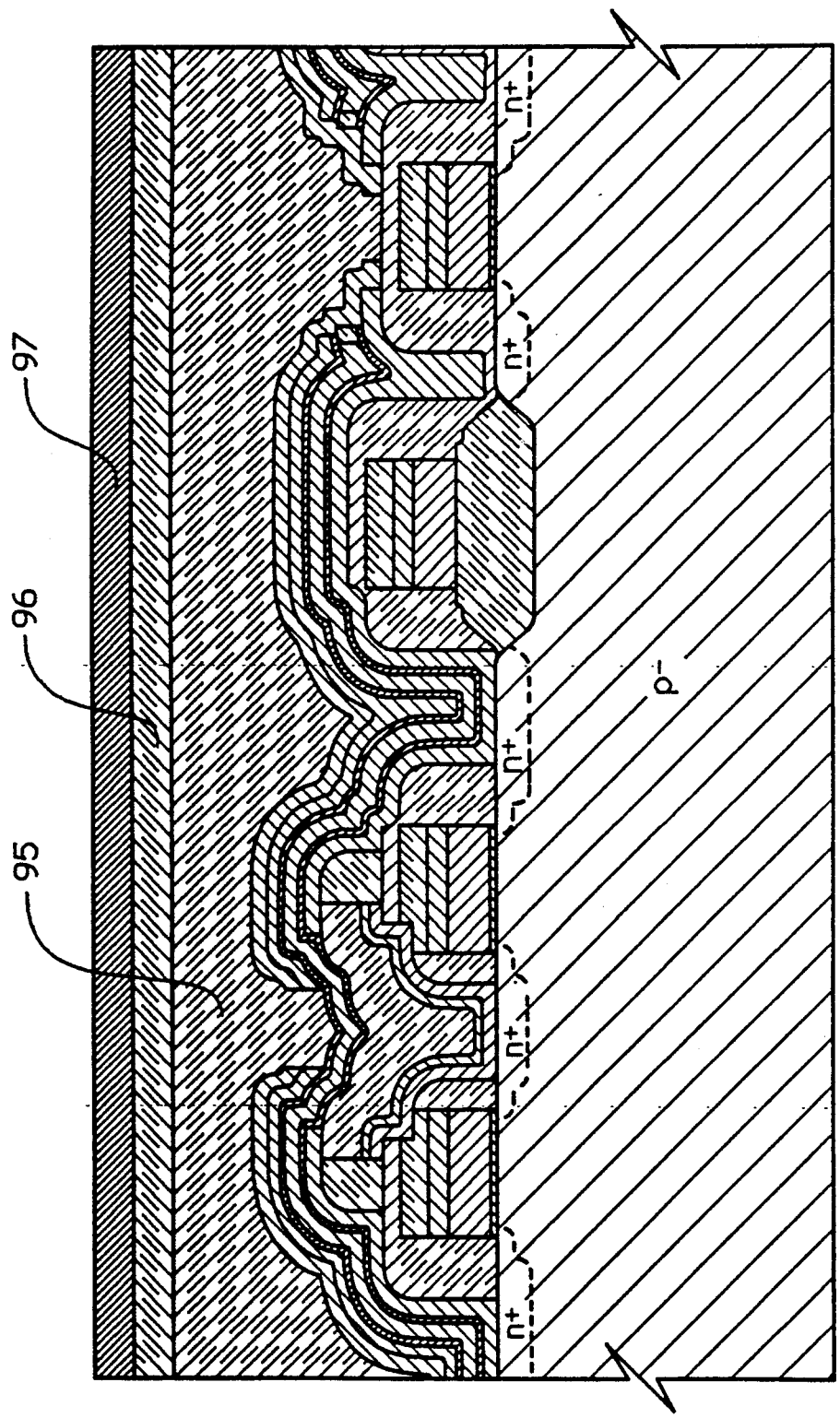

FIG. depicts a conventional planar DRAM cell;

FIG. 2 depicts a DRAM cell having a conventional trench capacitor;

FIG. 3 depicts a DRAM cell having a conventional stacked capacitor;

FIG. 4 depicts a DRAM cell constructed in accordance with U.S. Pat. No. 4,864,464;

FIG. 5 depicts a DRAM cell of stacked design during the fabrication process following field oxidation, transistor and word line formation, the deposition, doping and patterning of a lower storage-node poly layer, the deposition of a first nitride layer, and the deposition of a cell plate layer;

FIG. 6 depicts the DRAM cell cf FIG. 5 following the deposition of a second nitride layer, and the deposition and masking of a upper storage-node poly layer;

FIG. 7 depicts the DRAM cell of FIG. 6 following the etching of a channel down to the first nitride layer and photoresist strip;

FIG. 8 depicts the DRAM cell of FIG. 7 following the oxidation of the upper surface of the upper storage-node poly layer and the edges of the field or cell plate layer;

FIG. 9 depicts the DRAM cell of FIG. 8 following the removal of the oxide accumulated on top of the upper storage-node poly layer using an anisotropic etch and the removal of exposed nitride with a nitride etch;

FIG. 10 depicts the DRAM cell of FIG. 9 following the deposition of a storage-node-tying poly layer and patterning of that layer with photoresist;

FIG. 11 depicts the DRAM cell of FIG. 10 following the etching of the tying layer and upper storage-node layer and photoresist strip; and FIG. 12 depicts the DRAM cell of FIG. 11 following the deposition of a planarized BPSG layer and a pair of passivation layers.

PREFERRED EMBODIMENT OF THE INVENTION

Referring now to FIG. 5, a DRAM cell 51 having a double-layer, stacked-capacitor 52 and a buried bit line 53 is depicted in cross-sectional format. Because the cross-section has been taken on a diagonal cut through the array, three field effect transistors (FET) having 54A, 54B and 54C, respectively, are shown. FET gate 54B pertains to cell 51. The cell capacitor 52, as shown in this figure, may be used in a manufacturable 4-megabit DRAM array. Capacitor 52 is built on top of word line 55, which, in turn, is constructed on top of field oxide layer 56. Capacitor 52 is comprised of a first polycrystalline silicon (hereinafter also "polysilicon" or "poly") layer 57 that has been conductively doped and patterned with a first photo mask (not shown) to create a storage-node plate, and a second poly layer 58 that has been conductively doped to function as the field or cell plate. First poly layer 57 is in electrical contact with the storage-node junction 59 of the cell's field effect transistor (FET) 54B. First poly layer 57 is insulated from second poly layer 56 by first nitride layer 60. Were this particular cell shrunk to the extent necessary to create a 16-megabit DRAM array of commercially-acceptable size, the cell capacitor would have insufficient capacity to provide a reliable column sense amp signal. Therefore, in order to adapt cell 51 for use in a 16-megabit generation DRAM array, plate area of capacitor 52 must be increased. The present invention provides a process for nearly doubling cell capacitance of a DRAM cell of stacked-capacitor design through the use of only one additional masking step. FIGS. 6 through 12 show this process step by step.

Referring now to FIG. 6, a second silicon nitride layer 61 has been blanket deposited on the cell (in reality, over the entire array), followed by the blanket deposition of a third polysilicon layer 62. A second photoresist mask 63 is used to define an exposed region 64, which overlaps a tying region 65 of first poly layer 57. Second photoresist mask 63 is also used to clear the chip's peripheral areas of third poly layer 62. Therefore, second photoresist mask 63 does not add to the number of masks required for chip production.

Referring now to FIG. 7, a first polysilicon etch, followed by a first nitride etch, followed by a second polysilicon etch and removal of first photoresist mask 63 has created a channel 71 in said exposed region which extends downward to said first silicon nitride layer 60.

Referring now to FIG. 8, the cell has been exposed to a wet oxidation step, which has caused the growth of a silicon dioxide layer 81 on top of third polysilicon layer 62. In addition, the edges of second polysilicon layer 58 have become oxidized, creating silicon dioxide border 82. It should be noted that the doped polysilicon which comprises second poly layer 58 has oxidized at a more rapid rate than the undoped polysilicon of third poly layer 62.

Referring now to FIG. 9, an anisotropic dry etch has removed silicon dioxide layer 81 without removing or thinning silicon dioxide border 82. A second nitride etch then removes an exposed edge 91 of second nitride layer 61 and an exposed portion of first nitride layer 60 in the region of channel 71.

Referring now to FIG. 10, a fourth polysilicon layer 92 has been blanket deposited over the surface of the cell. Fourth poly layer 92 makes electrical contact with tying region 57. Following the doping of fourth poly layer 92 and third poly layer 62 with phosphorus, the cell is masked with a third photoresist mask 93. In the region of channel 71, third photoresist mask 93 patterns only fourth polysilicon layer 92. However, at other cell boundaries, second mask 93 patterns both third poly layer 62 and fourth poly layer 92.

Referring now to FIG. 11, a polysilicon etch has resulted in a completed folded-plate, stack capacitor 94. First poly layer 57 functions as the lower storage-node plate, second poly layer 58 functions as the field or cell plate, and third poly layer 62 functions as the upper storage-node plate. Fourth poly layer 92 ties third poly layer 62 to first poly layer 57. However, once the fabrication of capacitor 94 is complete, upper storage-node plate layer 62 and tying layer 92 are indistinguishable. Therefore, they shall be referred to collectively as the capacitor×s upper storage-node plate/tying layer. In spite of the fact that poly layers 62 and 92 can no longer be individually distinguished, a scanning electron microscope will readily reveal the two-layer design of this layer. Were a single polysilicon layer utilized for both the tying layer and the upper storage-node capacitor plate, the thickness of the lower storage-node capacitor plate plus the thickness of the upper storage-node capacitor plate would be equal to the total thickness of the polysilicon layer in the tying region 65 at the edge of the capacitor, where the two layer segments are both horizontal and in intimate contact. This, of course, is not the case. The total thickness of polysilicon in tying region 65 (where tying layer 92 overlaps lower storage-node capacitor plate 57), is substantially less than the sum of the lower storage-node capacitor plate thickness and the thickness of the pair of indistinguishable, fused polysilicon layers (i.e., layers 62 and 92). The deficiency in thickness is the thickness of polysilicon layer 62. Third photoresist mask 93 is then removed.

Referring now to FIG. 12, the cell is completed in a conventional manner, with a planarized boro-phosphosilicate glass (BPSG) layer 95, a silicon dioxide passivation layer 96 and a silicon nitride passivation layer 97.

Although only a single embodiment of the new stacked DRAM cell has been disclosed, it will be apparent to those having ordinary skill in the art, that changes may be made thereto without departing from the spirit and the scope of the invention as claimed.

I claim:

1. In a DRAM cell constructed on a silicon substrate, said cell having a capacitor for storing an electrical charge and a field-effect access transistor through which said capacitor may be charged and discharged, said transistor having a first heavily-doped n-type region within said substrate for a storage-node junction and a second heavily-doped n-type region within said substrate for an access-node junction, said capacitor comprising:

a conductively–doped polysilicon lower storage-node plate layer having upper and lower surfaces and substantially vertical edges, the lower surface of said lower storage-node plate layer being in electrical communication with said storage-node junction and a portion of the upper surface thereof serving as a tying region;

a first non-oxide dielectric layer superjacent said lower storage-node plate layer, said first dielectric layer being coextensive with said lower storage-node plate layer except in said tying region;

a conductively-doped polysilicon field plate layer superjacent said first dielectric layer and coextensive therewith, said field plate layer having upper and lower surfaces and a substantially vertical edge adjacent to said tying region, said vertical edge having been oxidized to form a dielectric border along its enter length, said first dielectric layer insulating the lower surface of said field plate layer from the upper surface and vertical edges of said lower storage-node plate layer;

a second non-oxide dielectric layer superjacent said field plate layer and said dielectric border, said second dielectric layer being coextensive with said field plate layer and a portion of said dielectric border extending along the entire length of said adjacent vertical edge; and a conductively-doped polysilicon upper storage-node plate/tying layer having upper and lower surfaces, said upper storage-node plate/tying layer being coextensive with said dielectric layer and insulated from the upper surface of said field plate layer by said second dielectric layer, in addition to extending over said dielectric border, being in contact with an edge of said first dielectric layer, and making electrical contact with said tying region of said lower storage-node plate.

2. The capacitor of claim 1, wherein said first and second dielectric layers are comprised of silicon nitride.

3. The capacitor of claim 1, wherein the width of said dielectric border is at least ten times the thickness of said second dielectric layer.

4. The capacitor of claim 3, wherein the thickness of that portion of said upper storage-node plate/tying layer that is superjacent said second dielectric layer, plus the thickness of the lower storage-node plate layer is greater than the total thickness of polysilicon in the tying region where said upper storage-node plate/tying layer makes contact with said lower storage-node plate layer.

* * * * *